United States Patent
Dogruoz et al.

(10) Patent No.: US 11,122,705 B2
(45) Date of Patent: Sep. 14, 2021

(54) LIQUID COOLED OPTICAL CAGES FOR OPTICAL MODULES

(71) Applicant: Cisco Technology, Inc., San Jose, CA (US)

(72) Inventors: M. Baris Dogruoz, Santa Clara, CA (US); Mandy Hin Lam, Fremont, CA (US); Pirooz Tooyserkani, Saratoga, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/246,914

(22) Filed: Jan. 14, 2019

(65) Prior Publication Data

US 2020/0229321 A1 Jul. 16, 2020

(51) Int. Cl.
*H05K 7/20* (2006.01)
*H04B 1/06* (2006.01)

(52) U.S. Cl.
CPC ..... *H05K 7/20254* (2013.01); *H05K 7/20263* (2013.01); *H05K 7/20272* (2013.01); *H04B 1/06* (2013.01)

(58) Field of Classification Search
CPC .......... H05K 7/20254; H05K 7/20263; H05K 7/20272; H04B 1/06
See application file for complete search history.

(56) References Cited

U.S. PATENT DOCUMENTS

| | | | |
|---|---|---|---|
| 6,665,184 B2 | 12/2003 | Akselband | |
| 8,014,150 B2 | 9/2011 | Campbell et al. | |
| 8,534,930 B1 | 9/2013 | Lima | |
| 8,760,855 B2 | 6/2014 | Howes et al. | |
| 10,777,939 B2* | 9/2020 | Lanzone | G02B 6/4269 |
| 2007/0121299 A1 | 5/2007 | Campbell et al. | |
| 2014/0154912 A1* | 6/2014 | Hirschy | H01R 13/46 439/487 |
| 2015/0077937 A1* | 3/2015 | Daly | G02B 6/428 361/700 |
| 2016/0062065 A1 | 3/2016 | Wu et al. | |
| 2016/0081221 A1 | 3/2016 | Neer et al. | |
| 2016/0174415 A1* | 6/2016 | Ito | G02B 6/4269 361/715 |

(Continued)

OTHER PUBLICATIONS

Experimental Validation of Fatigue Life of CCGA 624 Package with Initial Contact Pressure of Thermal Gap Pads under Random Vibration Excitation; Tae-Yong Park, Su-Hyeon Jeon, Su-Jeong Kim, (Year: 2018).*

(Continued)

*Primary Examiner* — Gordon A Jones

(74) *Attorney, Agent, or Firm* — Edell, Shapiro & Finnan, LLC

(57) ABSTRACT

An apparatus includes a cage structure and a cooling plate configured to contain a cooling liquid to cool the cage structure. The cage structure has a front end, a top surface adjacent to the front end, a first opening at the front end, and a second opening on the top surface. The first opening is configured to receive a pluggable optical module. The cooling plate is disposed on top of the second opening of the cage structure. The apparatus may further include a deformable pad disposed at the second opening of the cage structure and beneath the cooling plate.

20 Claims, 13 Drawing Sheets

(56) References Cited

U.S. PATENT DOCUMENTS

| | | | | |
|---|---|---|---|---|
| 2017/0135246 A1* | 5/2017 | Lunsman | ............ | H05K 7/20263 |
| 2017/0192185 A1* | 7/2017 | Kelty | ................... | H04B 10/801 |
| 2019/0208659 A1* | 7/2019 | Singh | ..................... | H05K 1/181 |
| 2019/0246523 A1* | 8/2019 | Boyden | ................ | H05K 7/2049 |
| 2019/0327859 A1* | 10/2019 | Iyengar | .............. | H05K 7/20772 |
| 2020/0006884 A1* | 1/2020 | Weltsch | ............. | H05K 7/20272 |

OTHER PUBLICATIONS

Ralph Remsburg, Amulaire Thermal Technology, "Non-Linear Fin Patterns in Cold Plates for Liquid Cooling", Oct. 2007, 6 pages.

Chuck Byers et al., Cisco Systems, Inc., "Method and Apparatus for Hybrid Liquid/Air Cooling of a Modular Electronic System", Oct. 29, 2013, 17 pages.

International Search Report and Written Opinion in counterpart International Application No. PCT/US2020/1020050, dated Apr. 1, 2020, 15 pages.

\* cited by examiner

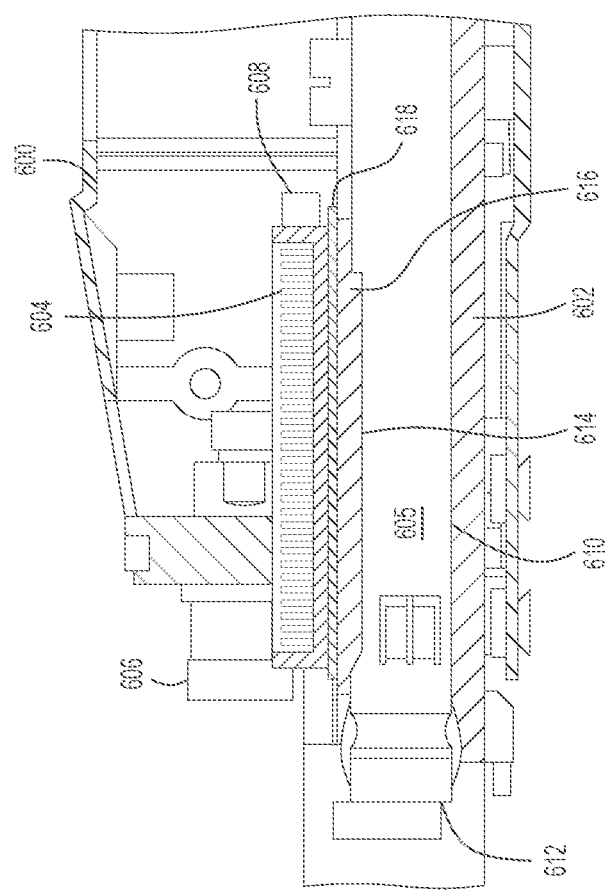

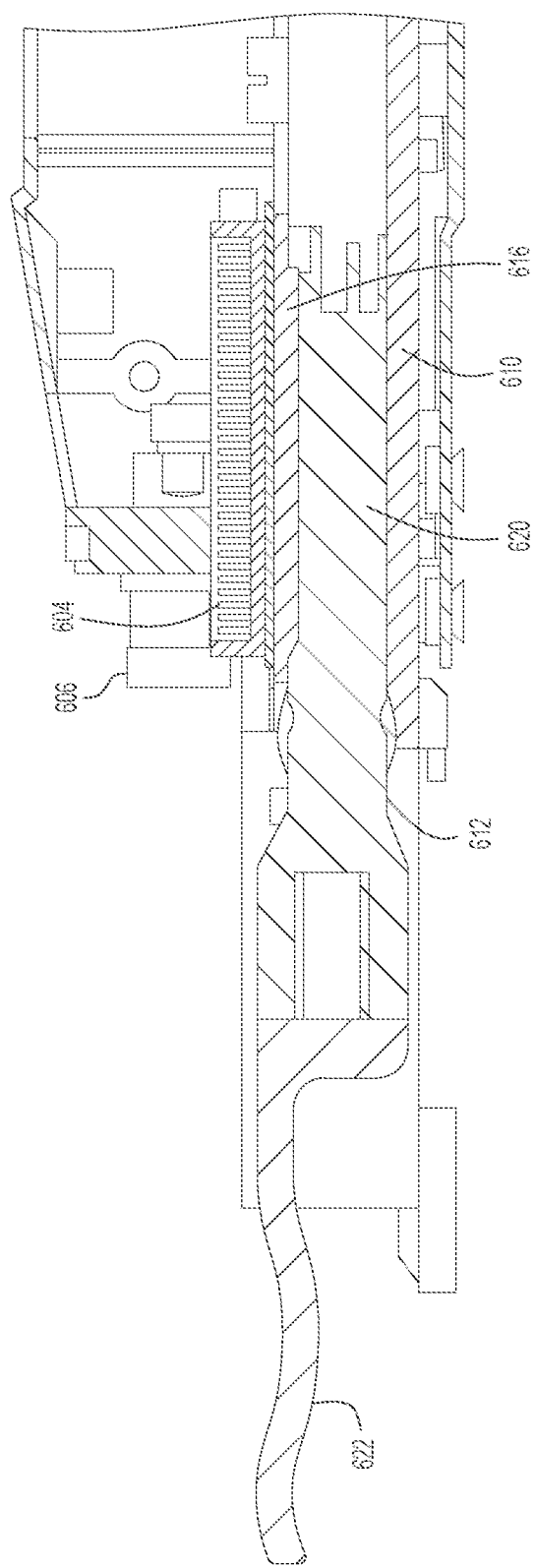

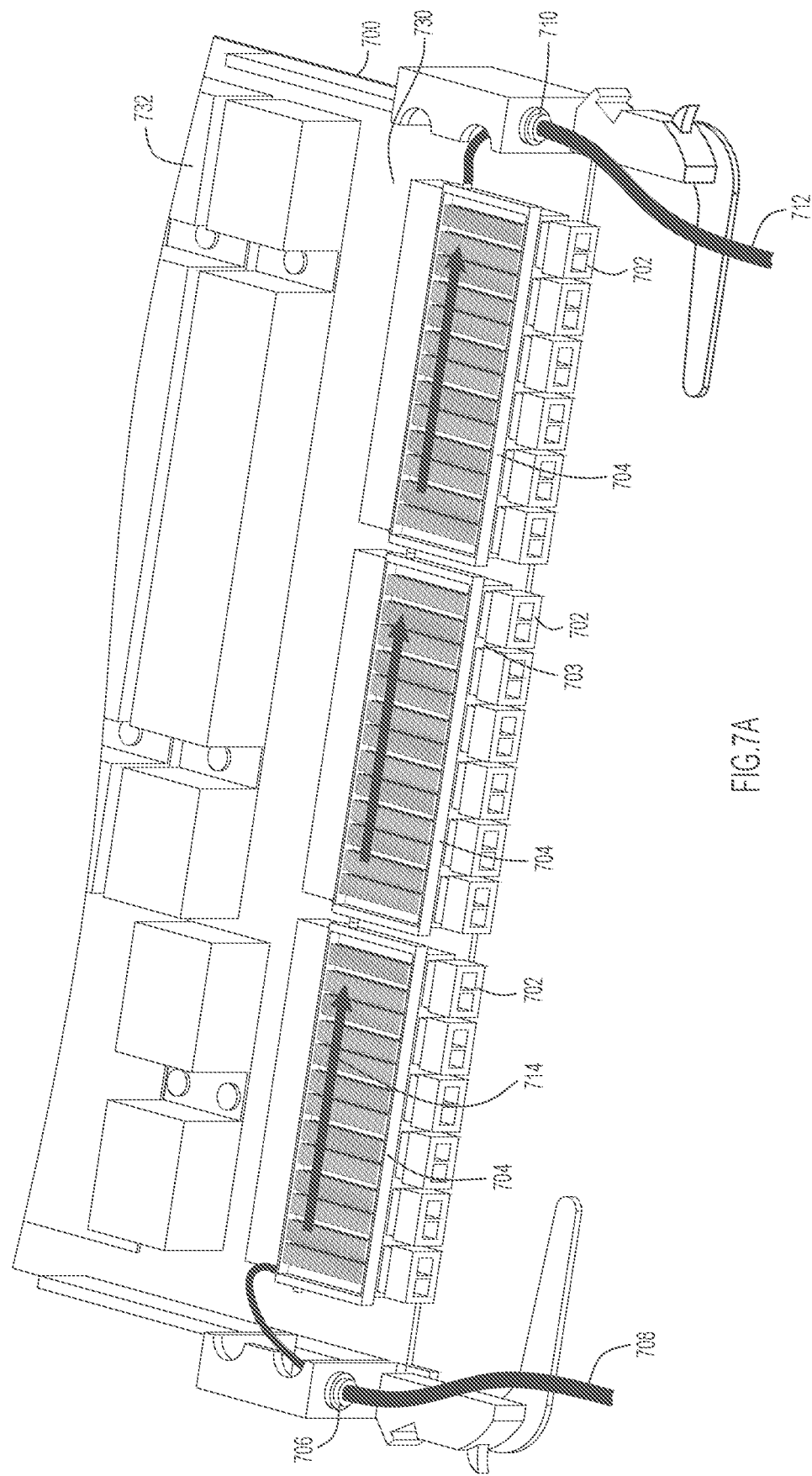

LIQUID COOLED OPTICAL CAGES FOR OPTICAL MODULES

TECHNICAL FIELD

The present disclosure relates to liquid cooled optical cages for optical modules.

BACKGROUND

Optical network devices play a role in the transport of data in networks. In particular, optical network devices contribute to the increase of data transport speeds in modern networks. As networking speeds increase, power consumption of the optical network devices increases, causing these devices to generate more heat. Optical modules are designed to manage heat dissipation.

BRIEF DESCRIPTION OF THE DRAWINGS

FIG. 6A is a side cutaway view of an apparatus having a cage structure and one or more cooling plates, according to one example embodiment.

FIG. 6B is a side cutaway view of the apparatus shown in FIG. 6A when a pluggable optical module is inserted and contained in the apparatus, according to one example embodiment.

FIG. 7A is an isometric view of an apparatus having one or more cage structures and one or more cooling plates, according to one example embodiment.

DESCRIPTION OF EXAMPLE EMBODIMENTS

Overview

An apparatus is provided for cooling an optical module of an optical network device. The apparatus includes a cage structure and a cooling plate configured to contain a cooling liquid to cool the cage structure. The cage structure has a front end, a top surface adjacent to the front end, a first opening at the front end, and a second opening on the top surface. The first opening is configured to receive a pluggable optical module. The cooling plate is disposed on top of the second opening of the cage structure.

Example Embodiments

Presented herein are various forms of an apparatus for cooling one or more optical modules of an optical network device. A 400 Gigabit (G) optical module in a Quad Small Form Factor Pluggable Double Density (QSFP-DD) form factor is estimated to dissipate heat in the range of 12-15 Watts (W). A next generation optical module is expected to dissipate more than 20 W of heat. The cooling apparatus structures disclosed herein achieve more effective heat dissipation to cool optical modules of an optical network device.

Figure 1:
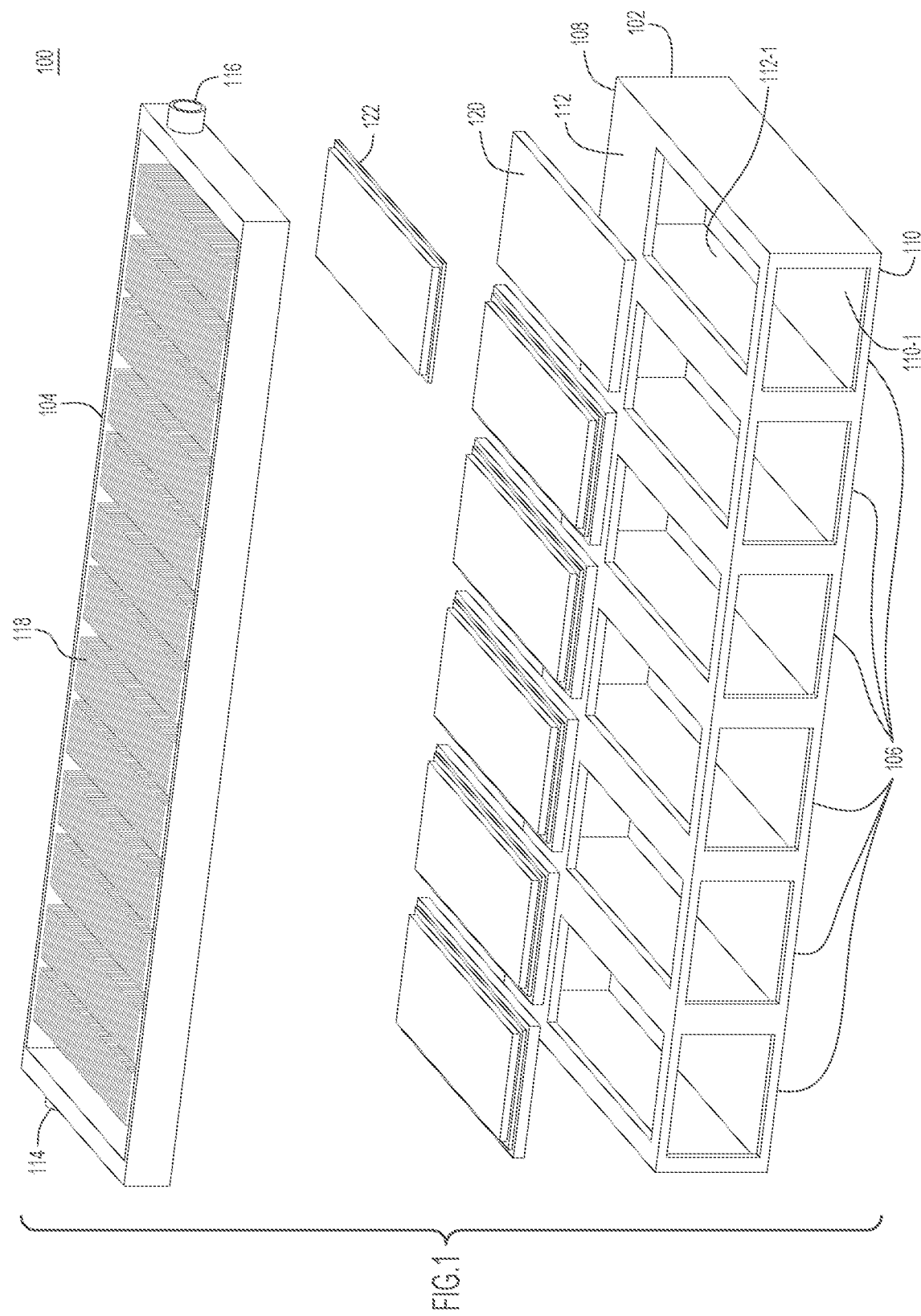
FIG. 1 is an exploded view of a cooling apparatus having a cage structure and configured to cool one or more optical modules of an optical network device, according to one example embodiment.

Reference is first made to FIG. 1. FIG. 1 is an exploded view of an apparatus 100 for cooling one or more optical modules, according to one example embodiment. In one configuration, the apparatus 100 includes a cage structure 102 and a cooling plate 104 disposed on the cage structure 102. The cage structure 102 may include one or more cages 106 configured to receive pluggable optical modules (not shown). The cage structure 102 as illustrated in FIG. 1 includes six cages 106 laterally adjacent to each other. Each of the cages 106 may be constructed with a metal frame 108, and includes a first (front) end 110, a top surface 112 adjacent to the front end 110, a first opening 110-1 at the front end 110, and a second (top) opening or aperture 112-1 on the top surface 112. The cooling plate 104 contains a cooling liquid configured to cool the cage structure 102. In one embodiment, the cooling plate is disposed on top of the second opening 112-1 of the cage structure 102 to dissipate heat generated by a pluggable optical module that is inserted into a first opening 110-1 of the cage structure during operation/use of the optical module.

The cooling plate 104 includes an inlet 114 configured to receive a cooling liquid and an outlet 116 configured to output the cooling liquid from the cooling plate 104. In some embodiments, the cooling plate 104 may further include a plurality of heat dissipation fins 118 configured to enhance heat dissipation capabilities of the apparatus 100.

In some embodiments, the apparatus 100 may further include one or more deformable pads 120 disposed at (on top of) the second openings 112-1 of the cage structure 102 and beneath the cooling plate 104. A size of a deformable pad 120 is slightly larger than a size of a second opening 112-1 so as to completely cover the second opening 112-1. This configuration protects the underlying optical modules plugged into the cage structure 102 in the event of any leaking of cooling liquid flowing through the cooling plate 104. As will be disclosed in further detail herein, the deformable pad 120 may be configured to deform by physical engagement with a pluggable optical module when the pluggable optical module is inserted into a cage 106 of the cage structure 102. In some embodiments, as an alternative to individual deformable pads 120 disposed on top of each second opening 112-1, a continuous deformable pad sheet may be provided to cover all of the second openings 112-1.

In some embodiments, the deformable pad 120 includes a compressible material with a low thermal conductivity to provide and maintain physical contact between the pluggable optical modules or the cages 106 and the cooling plate 104. In one embodiment, the deformable pad 120 is made of a material having an effective thermal conductivity ($k_{eff}$) of 0.8 W/mK, which results in a thermal conductance of approximately, 1,650 W/m²K. In another embodiment, the deformable pad 120 includes or is formed of a carbon velvet thermal interface gasket that has a conductance exceeding of 7,000 W/m²K in, for example, low contact pressure applications (<10 psi). The material for the deformable pad 120 is not limited to these example. Any suitable material may be employed for the deformable pad 120.

In some embodiments, the apparatus 100 may further include an adhesive layer 122 disposed between the cooling plate 104 and the deformable pad 120. The adhesive layer 122 may help to secure the cooling plate 104 to the cage structure 102.

Figure 2A:
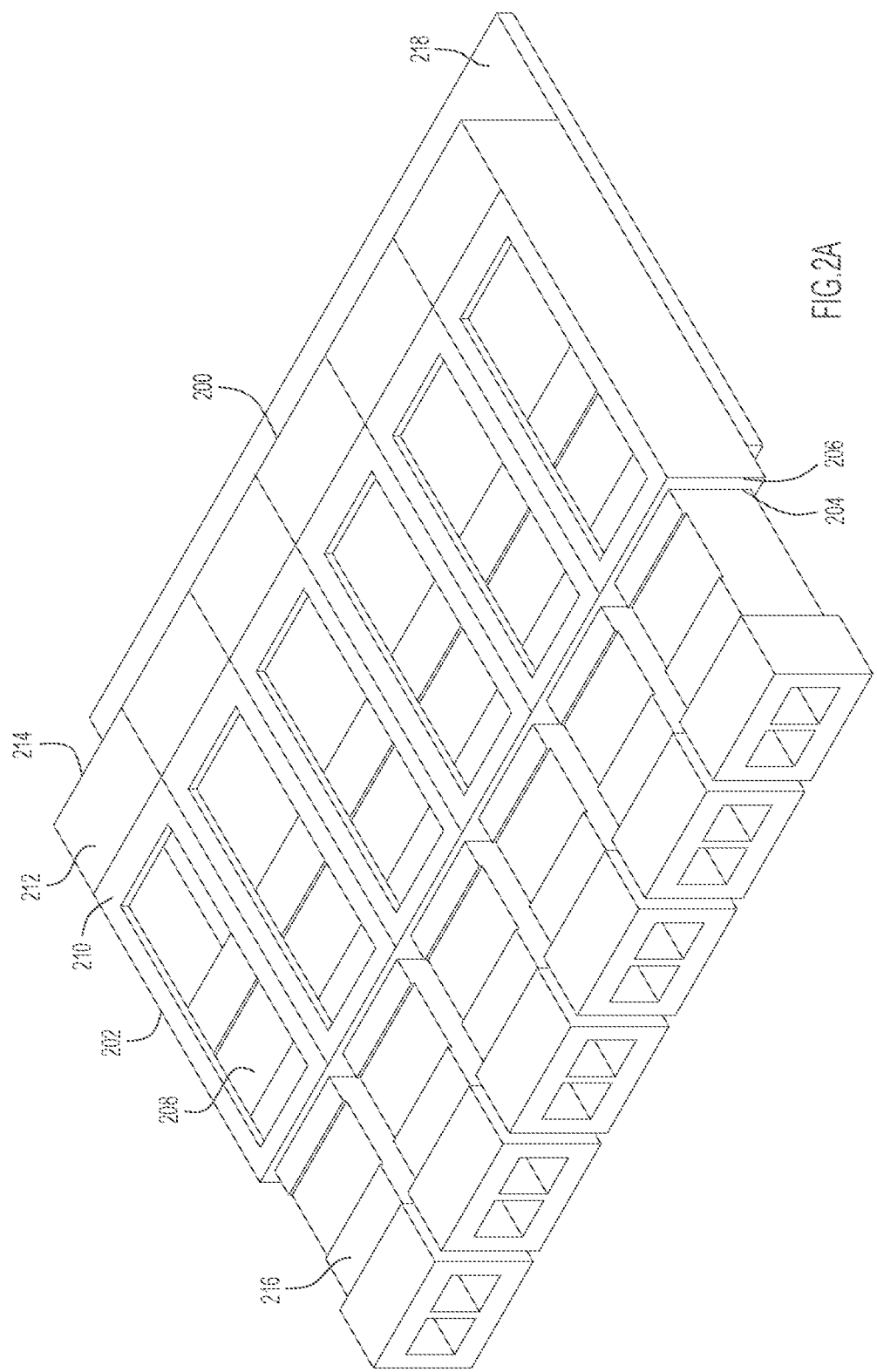
FIG. 2A is a perspective view showing a cage structure to be employed in the cooling apparatus, according to one example embodiment.

Reference is now made to FIG. 2A. FIG. 2A is a perspective view showing a cage structure 200, according to one example embodiment. The cage structure 200 includes one or more cages 202 (six cages being shown in FIG. 2A). Each of the cages 202 includes a first opening 204 at a first end 206, a second opening 208 on a top surface 210, and a connector 212 at a second end 214 opposite to the first end 206. As shown in FIG. 2A, a pluggable optical module 216 is inserted into and resides in a cavity of a cage 202. The pluggable optical module 216 is inserted into the cage 202 via the first opening 204 of the cage 202. In some embodiments, the cage structure 200 may further include a printed circuit board (PCB) 218 that includes one or more electronic components thereon.

Figure 2B:
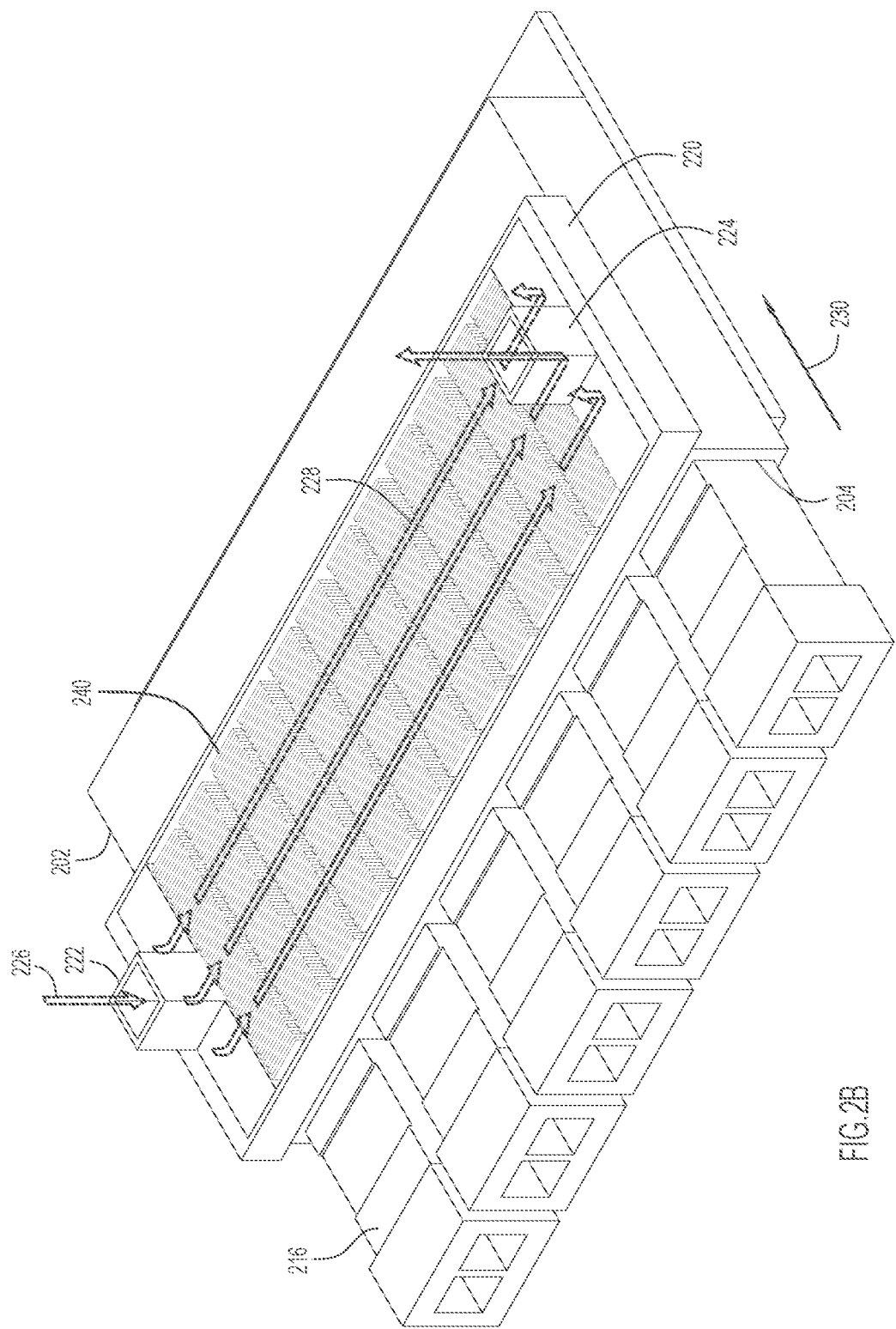
FIG. 2B is a perspective view showing the cage structure of FIG. 2A partially covered by a cooling plate, according to one example embodiment.

FIG. 2B is a perspective view of the cage structure 200 shown in FIG. 2A partially covered by a cooling plate 220, according to one example embodiment. The cooling plate 220 is disposed on top of the second openings 208 so as to cover the second openings 208. The cooling plate 220 includes an inlet 222 and an outlet 224. As shown at 226, a cooling liquid is supplied at the inlet 222 and moves in a flow direction 228 through cooling plate 220 to the outlet 224. The flow direction 228 is perpendicular to an orientation 230 in which the pluggable optical module 216 resides in a cage 202 of the cage structure 200. In some embodiments, the cooling plate 220 includes a plurality of heat dissipation fins 240 arranged in a longitudinal direction aligned with the flow direction 228. The cooling liquid 226 may be water, dielectric fluids, or other suitable liquids that are capable of dissipating heat form the cage structure 200. In some embodiments, to prevent damage to the electronic components in the cage structure 200 in the event of a leak, the cooling liquid 226 is a dielectric fluid.

Figure 3:
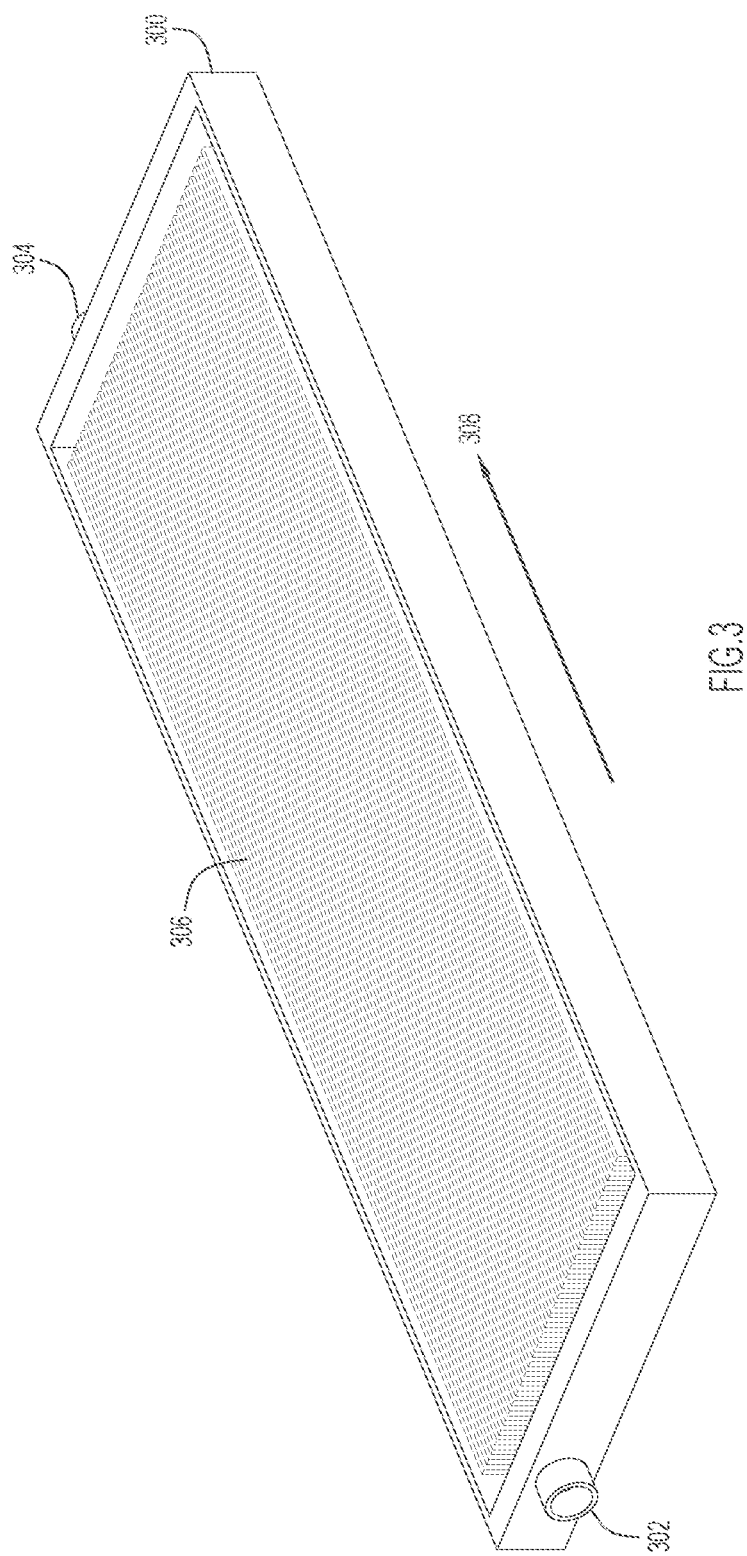
FIG. 3 is an isometric view of the cooling plate, according to one example embodiment.

FIG. 3 is an isometric view of a cooling plate 300 for cooling optical modules in a cage structure, according to one example embodiment. The cooling plate 300 includes an inlet 302 configured to receive a cooling liquid, an outlet 304 configured to discharge the cooling liquid out of the cooling plate, and heat dissipation fins 306. The heat dissipation fins 306 are disposed parallel to each other in a longitudinal direction aligned with a flow direction 308 in which the cooling liquid moves from the inlet 302 toward the outlet 304.

Figure 4A:
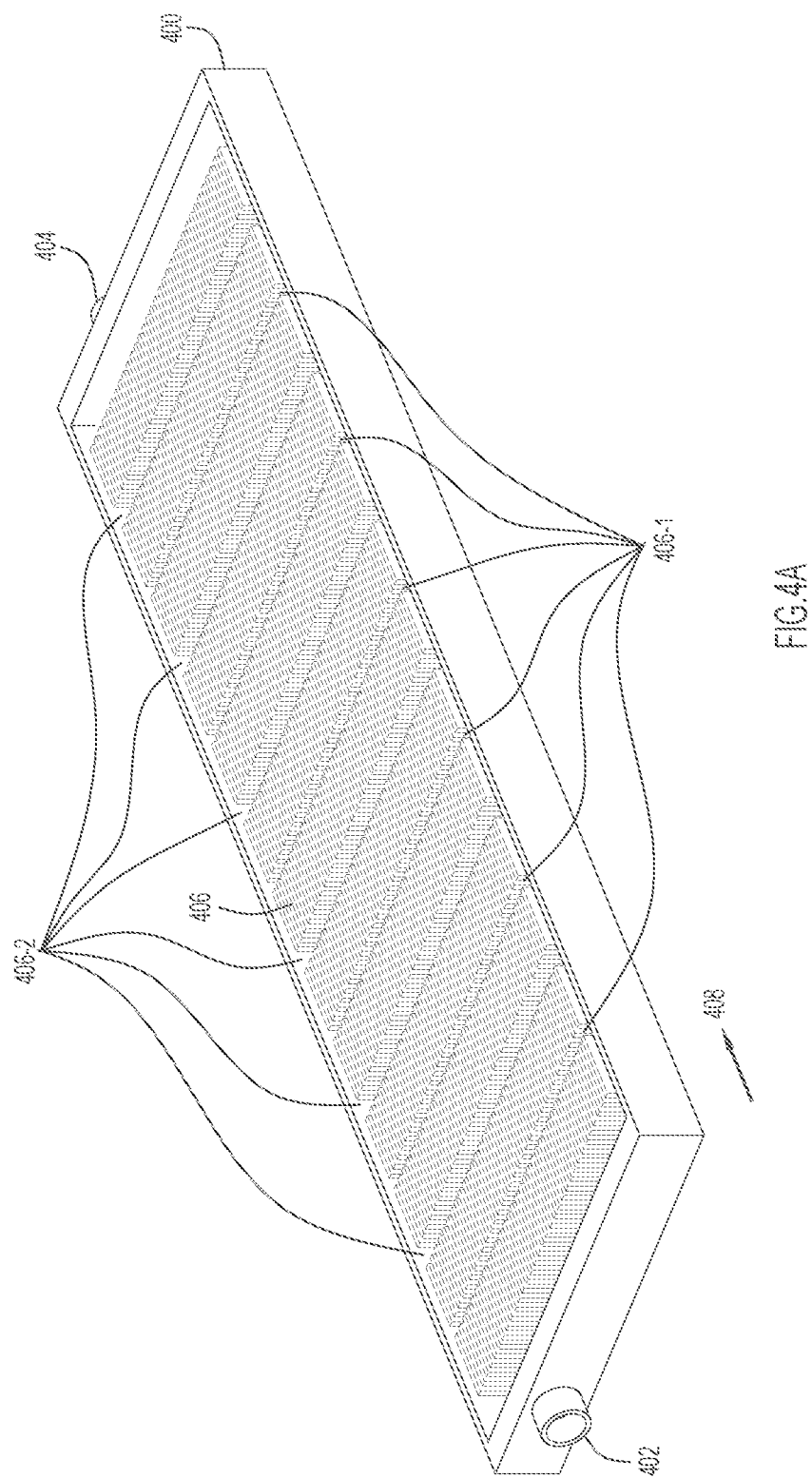
FIG. 4A is an isometric view of the cooling plate, according to another example embodiment.

FIG. 4A is an isometric view of a cooling plate 400 for a cage structure, according to one example embodiment. The cooling plate 400 includes an inlet 402, an outlet 404, and heat dissipation fins 406. One or more of primary fin cuts/grooves 406-1 and one or more of secondary fin cuts/grooves 406-2 are provided. The primary fin cuts 406-1 are positioned to coincide with the top openings (e.g., openings 112-1 shown in FIG. 1 and openings 208 shown in FIG. 2A) of a cage structure, and the secondary fin cuts 406-2 are positioned to align between two adjacent top openings (e.g., openings 112-1 shown in FIG. 1 and openings 208 shown in FIG. 2A) and outside of the top openings. The secondary fin cuts 406-2 may have a width greater than that of the primary fin cuts 406-1. The heat dissipation fins 406 are disposed parallel to each other in a longitudinal direction aligned with the flow direction 408 in which the cooling liquid moves from the inlet 402 toward the outlet 404.

Figure 4C:
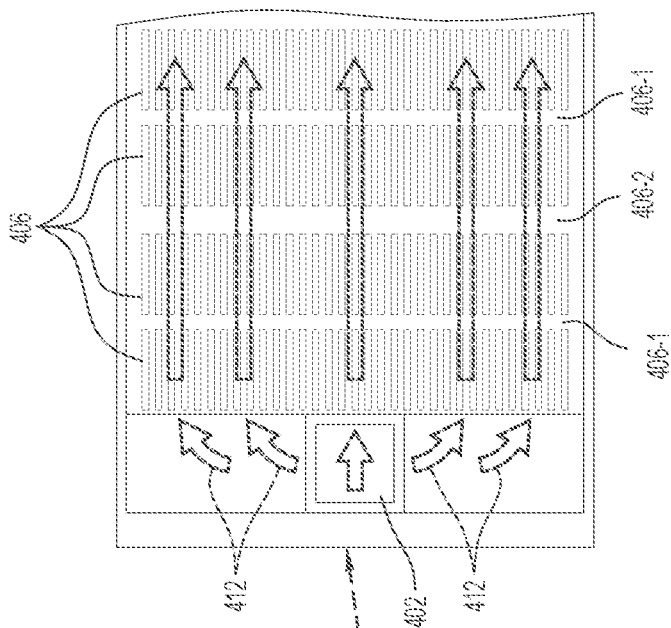
FIGS. 4B and 4C are views showing liquid flows through the cooling plate of FIG. 4A, according to one example embodiment.
Figure 4B:
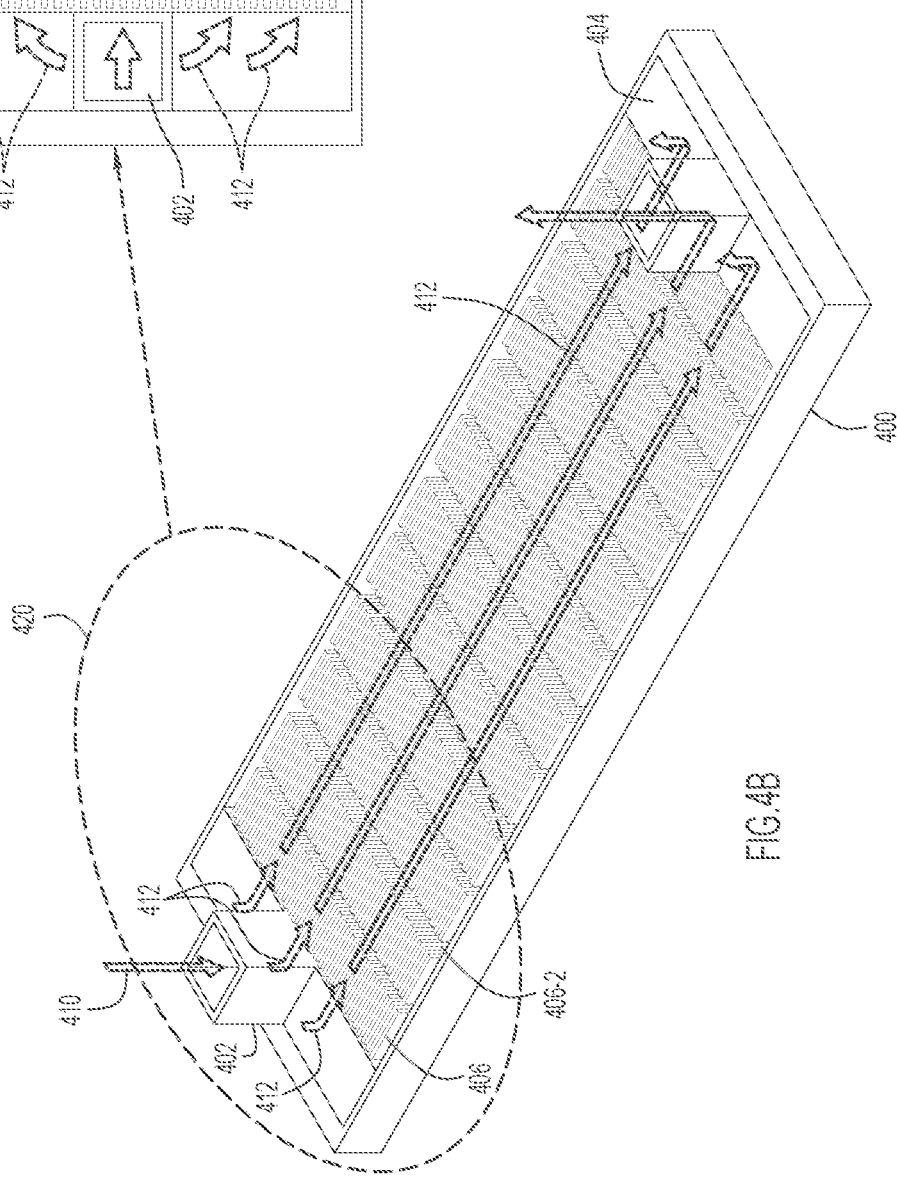

Turning now to FIGS. 4B and 4C, a more detailed description is provided for the cooling plate 400 with heat dissipation fins 406 and fin cuts 406-1 and 406-2. FIG. 4B is a perspective view of the cooling plate 400. As shown at 410, as a cooling liquid is injected into the inlet 402 of the cooling plate 400, the cooling liquid 410 is dispersed by the heat dissipation fins 406 into a plurality of manifold flows 412.

FIG. 4C is an enlarged top view of a region 420 at the cooling plate 400 shown in FIG. 4B. As illustrated in FIG. 4C, the manifold flows 412 move through micro channels created by the heat dissipation fins 406. The manifold flows 412 pass through the heat dissipation fins 406, the primary fin cuts 406-1, and the secondary fin cuts 406-2. The primary fin cuts 406-1 and the secondary fin cuts 406-2 are designed to enhance the capacity of heat dissipation of the cooling plate 400. For internal manifold flows, it has been determined that a heat transfer coefficient is higher at the entry regions of the fins for the cooling liquid before the flows are fully developed. In a cooling plate with fins and fin cuts, the manifold flows 412 can be controlled to become developed but not completely developed, resulting in a higher heat transfer coefficient for the cooling plate. That is, the pressure of the cooling liquid is reduced in the micro-channels of the fins (resulting in a lower heat transfer coefficient) and is able to recover to a higher value at the fin cuts (resulting in a higher heat transfer coefficient). In some embodiments, a pressure drop of a cooling liquid through a cooling plate that has fins and fin cuts as disclosed herein is reduced (e.g., by 1-10%) compared to that of a cooling plate having straight fins without fin cuts. Consequently, a cooling plate having fins and fin cuts has a better heat transfer coefficient than a cooling plate having straight fins without fin cuts. In one embodiment, a mean heat transfer coefficient of the cooling plate having fins and fin cuts is improved (e.g., by 1-5%) compared to that of a cooling plate having straight fins without fin cuts.

Fins with fin cuts/grooves allow the flow of the cooling liquid to adjust itself to create more uniform velocity, pressure, and temperature profiles, which increase the thermal performance of the cooling plate. Fins with fin cuts/grooves also allow pressure recovery at the cuts, leading to a lower pressure drop compared to that of a design having continuous fins without fin cuts. In some embodiments, a cooling plate with fin cuts may improve the overall hydraulic performance (e.g., by up to 10%) by reducing the pressure drop for the cooling plate.

Figure 5:
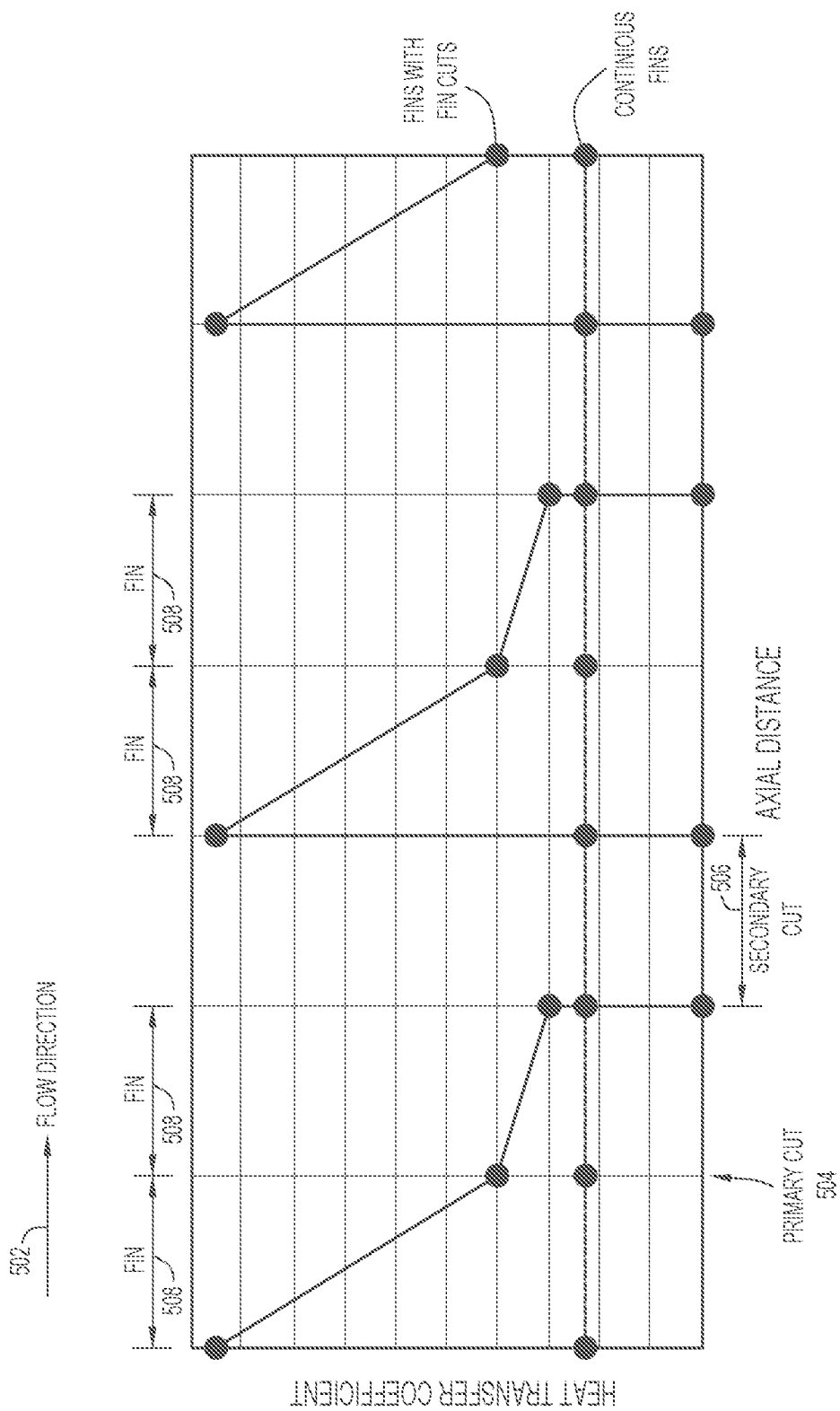
FIG. 5 is a diagram showing data associated with a comparative heat transfer coefficient study for cooling plates with and without fin cuts, according to one example embodiment.

FIG. 5 is a diagram showing data associated with a comparative heat transfer coefficient study for cooling plates with and without fin cuts, according to one example embodiment. In FIG. 5, the cooling liquid flows from the left to the right as indicated by an arrow 502. A region 504 indicates where a primary cut is located, while a region 506 indicates where a secondary cut is located. The locations of fins are shown at 508. As the cooling liquid flows into the fins 508, its pressure drops so that the heat transfer coefficient of the cooling liquid is reduced. When the cooling liquid arrives at the fin cuts, its pressure is allowed to recover. At the primary cut region 504, which is a narrower cut between fins 508, the pressure is allowed to slightly recover before the flows move into the fins again, such that the reduction of the heat transfer coefficient is abated. At the secondary cut region 506, which is a wider cut between two aligning fins, the pressure is allowed to recover such that the heat transfer coefficient is increased to a higher value at the entry of the next fin following the secondary cut region 506. A location of the primary cut region 504 is positioned to correspond to a location of a second opening 112-1 in FIG. 1, while the secondary cut region 506 is placed between two adjacent second openings 112-1. This design allows the portions of the cooling plate that have a greater heat transfer coefficient to coincide with the top openings which overlie the pluggable optical modules, thereby improving the heat dissipation capability of the cooling plate. A cooling plate design having primary fin cuts and secondary fin cuts as disclosed herein achieves a sizable reduction (e.g., 10%) in cooling liquid pressure drop and achieves better thermal performance than a cooling plate having straight fins without fin cuts.

Reference is made to FIGS. 6A and 6B. FIG. 6A is a side cutaway view of an apparatus 600 having a cage structure 602 and one or more cooling plates 604, according to one example embodiment. In some embodiments, the apparatus 600 may be a line card. The apparatus 600 may have one or more ports 605 to receive one or more pluggable optical modules. In one embodiment, the apparatus 600 includes 36 QSFP-DD ports with a lateral width less than 16 inches. The apparatus 600 further includes a main inlet 606 to receive a cooling liquid for the one or more cooling plates 604. The cooling liquid is directed to an inlet 608 of the cooling plate 604 through internal piping and plumbing (not shown). In one embodiment, the inlet 608 may be on a transverse plane depending the design for placing cooling plates 604 in parallel or in series to each other. The cage structure 602 includes one or more cages 610 that house one or more optical ports. The cage 610 includes a first opening 612 configured to receive a pluggable optical module, and a second opening 614 beneath the cooling plate 604. A deformable pad 616 is disposed at the second opening 614 and beneath the cooling plate 604. In some embodiments, an adhesive layer 618 is provided between the cooling plate 604 and the deformable pad 616.

FIG. 6B is a side cutaway view of the apparatus 600 of FIG. 6A, and showing a pluggable optical module 620 inserted and residing therein, according to one example embodiment. The pluggable optical module 620 is inserted into the cage 610 through the first opening 612. A cable 622, such as an optical fiber cable, is attached to the pluggable optical module 620. When the pluggable optical module 620 is inserted into the cage 610, the pluggable optical module 620 causes the deformable pad 616 to deform and be compressed to a reduced thickness. In some embodiments, the thickness of the deformable pad is compressed by 5 to 80%. In this configuration, the deformable pad 616 provides two functions. First, the deformable pad 616 helps to secure the pluggable optical module 620 firmly within the cage 610. Second, because the deformable pad 616 is pushed against the lower surface of the cooling plate 604, the deformable pad 616 helps to more effectively transfer the heat generated by the pluggable optical module 620 to the cooling plate 604.

In some embodiments, an apparatus having 6 cages laterally adjacent to each other may be cooled by a single cooling plate. When the cooling plate receives a dielectric cooling liquid having an initial temperature of 20° C. in a flow rate of 0.3 liter/minute per cage, the temperatures at the cages with optical modules inserted therein may be maintained at a temperature lower than 70° C. The individual cage temperatures are shown in Table 1 below. The pressure drop in the cooling plate is about 0.0157 psi.

TABLE 1

| Case Temperatures (° C.) | | | | | |
|---|---|---|---|---|---|
| Module 1 | Module 2 | Module 3 | Module 4 | Module 5 | Module 6 |
| 60.2 | 61.9 | 64.2 | 66.4 | 68.3 | 69.2 |

In another embodiment, when the cooling plate receives a dielectric cooling liquid having an initial temperature at 20° C. in a flow rate of 0.9 liter/minute, the temperatures at the cages with optical modules inserted therein may be maintained at a temperature lower than 60° C. The individual cage temperatures are shown in Table 2 below. The pressure drop in the cooling plate is about 0.0875 psi.

TABLE 2

| Case Temperatures (° C.) | | | | | |
|---|---|---|---|---|---|
| Module 1 | Module 2 | Module 3 | Module 4 | Module 5 | Module 6 |
| 55.4 | 56.0 | 56.9 | 57.6 | 58.4 | 58.5 |

Figure 7B:
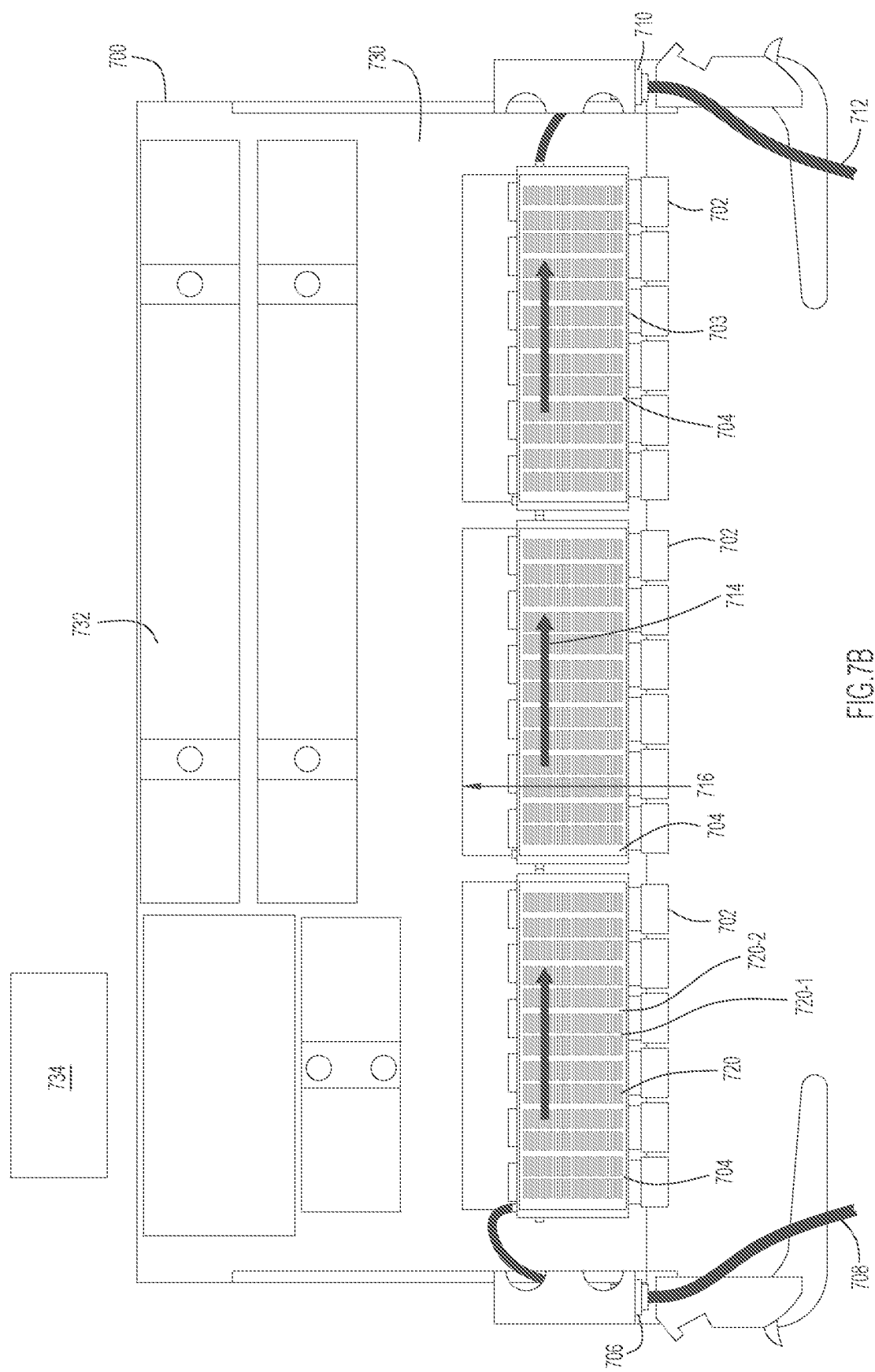
FIG. 7B is a top view of the apparatus shown in FIG. 7A.

FIGS. 7A and 7B show an apparatus 700 having a plurality of cage structures 702 and a plurality of cooling plates 704 connected in series with each other, according to one example embodiment. FIG. 7A is an isometric view of the apparatus 700 while FIG. 7B is a top view of the apparatus 700. In some embodiments, the apparatus 700 may be a line card having 36 QSFP-DD ports with a lateral width less than 16 inches. In the illustrated embodiment, the apparatus 700 includes three cage structures 702 and three cooling plates 704 connected to each other in series. However, this is not meant to be limiting. Any number of the cage structures and cooling plates may be employed. Each of the cage structures 702 includes a plurality of cages 703, each of which includes a first opening and a second opening similar to those disclosed above. The cooling plates 704 are disposed on top of the cage structures 702 to dissipate heat generated by pluggable optical modules residing in the cages. In some embodiments, each cooling plate 704 is disposed on top of at least one of the second openings of the cages. Each of the cooling plates 704 includes an inlet and an outlet as described above. The cooling plates 704 are connected to each other in series such that the outlet of one cooling plate is coupled to the inlet of a next cooling plate.

The apparatus 700 includes a main inlet 706 attached to an inlet pipe 708. The main inlet 706 is configured to receive a cooling liquid for the cooling plates 704. The apparatus 700 further includes a main outlet 710 attached to an outlet pipe 712. The main outlet 710 is configured to output the cooling liquid that has been circulated through the cooling plates 704 to the outlet pipe 712. Each cooling plate 704 is configured to move the cooling liquid in a flow direction 714 perpendicular to an orientation 716 in which the pluggable optical module resides in a respective cage. The cooling plates 704 are aligned along a direction parallel to the flow direction 714. Each cooling plate 704 is configured to cover six second openings belonging to six cages in the example. In some embodiments, the inlet pipe 708 and one or more of the cooling plates 704 can be covered with a thin layer of insulator (plastic, poly carbonate tape, etc.) to avoid direct contact with the air, thereby avoiding moisture condensation and degradation to the thermal performance of the cooling plates 704. These insulation layers can easily be applied and reinforced against physical damage.

Each cooling plate 704 includes a plurality of heat dissipation fins 720. The fins 720 have primary fin cuts 720-1 and secondary fin cuts 720-2 in an orientation 716 perpendicular to the flow direction 714. As described above, the secondary fin cut 720-2 has a width greater than that of the primary fin cut 720-1, and a primary fin cut 720-1 is positioned to coincide with a top opening of a cage and a secondary fin cut 720-2 is positioned between two adjacent second (top) openings, to improve heat dissipation. In some embodiments, the apparatus 700 further includes a plurality of deformable pads each disposed at one of the second openings of the cages and beneath an associated cooling plate. Each of the deformable pads is configured to deform by engagement with a pluggable optical module when the pluggable optical module is plugged into a cage. In some embodiments, an adhesive layer is interposed between the cooling plates and the deformable pads.

In some embodiments, the apparatus 700 further includes a PCB 730 that includes one or more electronic components attached thereon. A plurality of heat sinks 732 each having a plurality of heat dissipation fins may be provided on the PCB 730. The apparatus 700 also includes one or more fans 734 to provide forced air flows through the heat sinks 732 to dissipate heat generated by the electronic components. The forced air flows may also further cool the cooling plate 704 disposed on top of the cages. Since preheating of air is reduced due to the liquid cooling of the optical modules, the downstream PCB components would experience lower temperatures.

In one embodiment, when the cooling plates 704 receive a dielectric cooling liquid having an initial temperature at 20° C. in a flow rate of 0.9 liter/minute, the temperatures at the cages with optical modules inserted therein may be maintained at a temperature lower than 70° C. The individual cage temperatures are shown in Table 3 below. The pressure drop in the cooling plates is about 0.263 psi.

TABLE 3

| Case Temperatures (° C.) | | | | | | |
|---|---|---|---|---|---|---|
| | Module 1 | Module 2 | Module 3 | Module 4 | Module 5 | Module 6 |
| $1^{st}$ Cage St. | 55.4 | 56.0 | 56.9 | 57.6 | 58.4 | 58.5 |
| $2^{nd}$ Cage St. | 61.1 | 61.7 | 62.6 | 63.3 | 64.1 | 64.2 |
| $3^{rd}$ Cage St. | 66.8 | 67.4 | 68.3 | 69.0 | 69.8 | 69.9 |

In some embodiments, the thermal performance of the apparatus 700 having the cooling plates 704 is enhanced by 2-3 times compared to an air cooled system. In some embodiments, if the dielectric cooling liquid is replaced with water, the apparatus 700 can cool up to 32 W per optical module, which results in dissipating more than 1150 W of all 36 optical modules in a line card with the aforementioned flow rates.

Figure 8A:
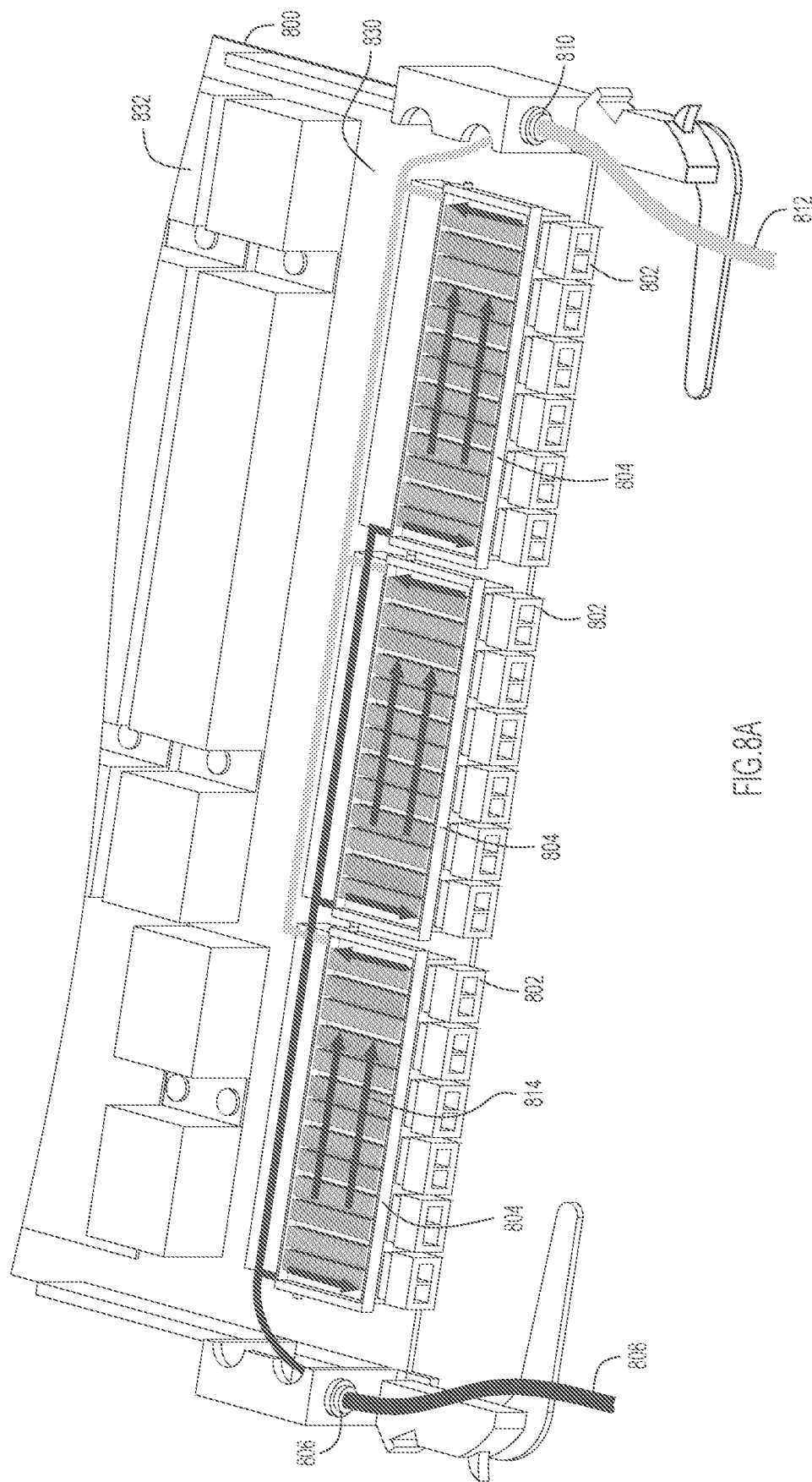
FIG. 8A is an isometric view of an apparatus having one or more cage structures and one or more cooling plates, according to another example embodiment.
Figure 8B:
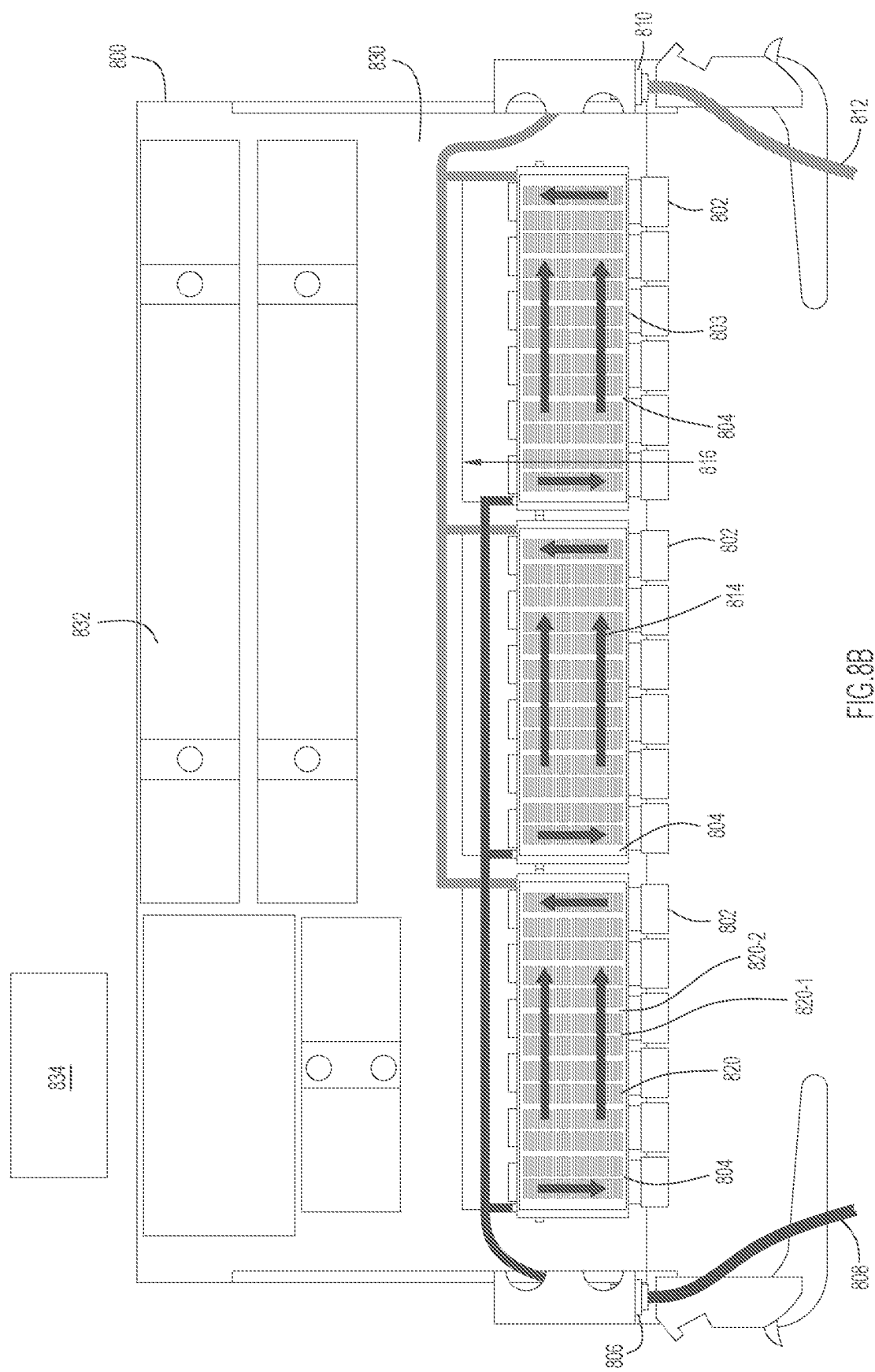
FIG. 8B is a top view of the apparatus shown in FIG. 8A.

FIGS. 8A and 8B show an apparatus 800 having a plurality of cage structures 802 and a plurality of cooling plates 804 connected in parallel with each other, according to one example embodiment. FIG. 8A is an isometric view of the apparatus 800 while FIG. 8B is a top view of the apparatus 800. In some embodiments, the apparatus 800 may be a line card having 36 QSFP-DD ports with a lateral width less than 16 inches. In the illustrated embodiment, the apparatus 800 includes three cage structures 802 and three cooling plates 804 connected to each other in parallel to each other. Any number of the cage structures and cooling plates may be employed. Each of the cage structures 802 includes a plurality of cages 803, each of which includes a front end opening and a top opening similar to that described above. The cooling plates 804 are disposed on top of the cage structures 802 to dissipate heat generated by pluggable optical modules residing in the cages. In some embodiments, each cooling plate 804 is disposed over at least one of the top openings of the cages. Each of the cooling plates 804 includes a liquid inlet and a liquid outlet similar to those disclosed above.

The apparatus 800 includes a main inlet 806 attached to an inlet pipe 808. The main inlet 806 is configured to receive a cooling liquid for the cooling plates 804. The apparatus 800 further includes a main outlet 810 attached to an outlet pipe 812. The main outlet 810 is configured to output the cooling liquid that has been circulated through the cooling plates 804 to the outlet pipe 812. The cooling plates 804 are connected to each other in parallel, i.e., all inlets of the cooling plates 804 are coupled to the main inlet 806 while all outlets of the cooling plates 804 are coupled to the main outlet 810.

Each cooling plate 804 is configured to move the cooling liquid in a flow direction 814 perpendicular to an orientation 816 in which the pluggable optical module resides in a respective cage. The cooling plates 804 are aligned along a direction parallel to the flow direction 814. In the illustrated embodiment, each cooling plate 804 is configured to cover six second openings belonging to six cages.

Each cooling plate 804 includes a plurality of heat dissipation fins 820. The fins 820 have primary fin cuts 820-1 and secondary fin cuts 820-2 in a direction perpendicular to the flow direction 814. A secondary fin cut 820-2 has a width greater than that of primary fin cut 820-1. A primary fin cut 820-1 is positioned to coincide with a top opening of a cage and a secondary fin cut 820-2 is positioned between two adjacent top openings to improve heat dissipation. In some embodiments, the apparatus 800 further includes a plurality of deformable pads each disposed at one of the second openings of the cages and beneath an associated cooling plate. Each of the deformable pads is configured to deform by engagement with a pluggable optical module when the pluggable optical module is plugged into a cage. In some embodiments, an adhesive layer is interposed between the cooling plates and the deformable pads.

In some embodiments, the apparatus 800 further includes a PCB 830 that includes one or more electronic components attached thereon. A plurality of heat sinks 832 each having a plurality of heat dissipation fins may be provided on the PCB 830. The apparatus 800 also includes one or more fans 834 to provide forced air flows through the heat sinks 832 to dissipate heat generated by the electronic components. The forced air flows may also further cool the cooling plate 804 disposed on top of the cages. Since preheating of air is reduced due to the liquid cooling of the optical modules, the downstream PCB components would experience lower temperatures.

In one embodiment, when the cooling plates 804 receive a dielectric cooling liquid having an initial temperature at 20° C. in a flow rate of 0.3 liter/minute, the temperatures at the cages with optical modules inserted therein may be maintained at a temperature lower than 70° C. The individual cage temperatures are shown in Table 4 below. The pressure drop in the cooling plates is about 0.0157 psi.

TABLE 4

| Case Temperatures (° C.) | | | | | | |
| --- | --- | --- | --- | --- | --- | --- |
| | Module 1 | Module 2 | Module 3 | Module 4 | Module 5 | Module 6 |
| 1st Cage St. | 60.2 | 61.9 | 64.2 | 66.4 | 68.3 | 69.2 |
| 2nd Cage St. | 60.2 | 61.9 | 64.2 | 66.4 | 68.3 | 69.2 |
| 3rd Cage St. | 60.2 | 61.9 | 64.2 | 66.4 | 68.3 | 69.2 |

In some embodiments, the thermal performance of the apparatus 800 having the cooling plates 804 is enhanced by 2 to 3 folds compared to an air cooled system. In some embodiments, if the dielectric cooling liquid is replaced with water, the apparatus 800 can cool up to 32 W per optical module, which results in dissipating more than 1150 W of all 36 optical modules in a line card with the aforementioned flow rates.

In some embodiments, a liquid cooled optical cage structure is equipped with a cooling plate installed on a top surface of the optical cage structure. The liquid cooled optical cage structure provides single phase liquid cooling that minimizes the overall form factor of the cooling plate to avoid interference with face plate features and other PCB components in close proximity. The cooling plate is equipped with internal micro-fins and micro-channels to minimize pressure drop and pumping power while improving the thermal performance. In some embodiments, a dielectric fluid is employed in the cooling plate to avoid damage to cage/modules in the case of a spill/leakage. In one embodiment, the flow rate for a cooling plate is controlled to be less than 0.25 gal/min (~0.94 l/min) with a pressure drop not to exceed 0.1 psi/cage.

In some embodiments, a deformable thermal interface material is employed to fill a gap between the top of a pluggable optical module and the bottom of a cooling plate to ensure good contact therebetween. The thickness/height of the deformable thermal interface material varies to provide good contact of the heat generating optical modules and the cooling plate. The deformable thermal interface material is configured to be durable and no material degradation for the lifetime of the cage structure.

In some embodiments, a line card employing the apparatus presented herein includes a liquid cooled optical cage with high power (QSFP-DD) optical modules. The high-power optical modules in the line card are cooled by at least one cooling plate.

The cooling liquid is not particularly limited to the examples provided above. Any type of fluids may be used in the liquid cooling techniques disclosed herein to satisfy or exceed the conditions given above. In one embodiment, a fluid is selected to ensure that the cooling plate design is effective to remove the heat generated by optical modules. If the cooling fluid is a dielectric, the electronics would not be damaged if a leakage of the cooling liquid occurs. In one embedment, the cooling fluid is selected so that it does not pose any serious health threats, such as a chemical reaction and fumes. In one embodiment, a dielectric fluid may be employed that has 86% smaller thermal conductivity, 64% smaller heat carrying capacity compared to that of water. In some embodiments, water may be used as the cooling liquid, which provides even higher heat-dissipation capacity. In some embodiments, the designs presented herein are able to cool at least 850 W associated with optical modules on one line card. If water is used as the cooling liquid, the designs presented herein are able to cool more than 1150 W associated with optical modules on one line card.

In summary, in one aspect, an apparatus is provided. The apparatus includes a cage structure having a front end, a top surface adjacent to the front end, a first opening at the front end, and a second opening on the top surface. The first opening is configured to receive a pluggable optical module. The apparatus further includes a cooling plate configured to contain a cooling liquid to cool the cage structure. The cooling plate is disposed on top of the second opening of the cage structure.

In some embodiments, the cooling plate includes an inlet configured to receive the cooling liquid and an outlet configured to output the cooling liquid from the cooling plate. The cooling plate is configured to move the cooling liquid in a flow direction perpendicular to an orientation in which the pluggable optical module resides in the cage structure.

In some embodiments, the cooling plate further a plurality of heat dissipation fins arranged in a longitudinal direction aligned with the flow direction.

In some embodiments, the plurality of heat dissipation fins have a plurality of fin cuts in a direction perpendicular to the flow direction.

In some embodiments, the plurality of fin cuts include a primary fin cut and a secondary fin cut. The secondary fin cut has a width greater than that of the primary fin cut. The primary fin cut is positioned to coincide with a second opening of the cage structure and the secondary fin cut is positioned between adjacent second openings of the cage structure.

In some embodiments, the apparatus further includes a deformable pad disposed at the second opening of the cage structure and beneath the cooling plate. The deformable pad is configured to deform by engagement with the pluggable optical module when the pluggable optical module is inserted into the cage structure.

In some embodiments, the deformable pad is configured to deform in thickness at 5 to 80%.

In some embodiments, the apparatus further includes an adhesive layer interposed between the cooling plate and the deformable pad.

In another aspect, an apparatus is provided. The apparatus includes a cage structure and a plurality of cooling plates configured to contain a cooling liquid to cool the cage structure. The cage structure includes a plurality of cages. Each of the plurality of cages has a first opening at a front end of the cage structure and a second opening on a top surface of the cage structure. each of first openings is configured to receive a pluggable optical module. Each cooling plate is disposed on top of at least one of the second openings of the cages.

In some embodiments, each of the cooling plates includes an inlet configured to receive the cooling liquid and an outlet configured to output the cooling liquid. Each cooling plate is configured to move the cooling liquid in a flow direction perpendicular to an orientation in which the pluggable optical module resides in a respective cage.

In some embodiments, the cooling plates are aligned along a direction parallel to the flow direction, and the cooling plates are connected in series such that the outlet of one cooling plate is coupled to the inlet of a next cooling plate.

In some embodiments, the cooling plates are aligned along a direction parallel to the flow direction, and the cooling plates are connected in parallel with each other.

In some embodiments, at least one of the plurality of cooling plates is configured to cover a plurality of the second openings.

In some embodiments, the at least one cooling plate includes a plurality of heat dissipation fins arranged in a longitudinal direction aligned with the flow direction.

In some embodiments, the apparatus further includes a plurality of deformable pads each disposed at one of the second openings of the cages and beneath an associated cooling plate. Each of the deformable pads is configured to deform by engagement with a pluggable optical module when the pluggable optical module is plugged into one of the plurality of cages.

In another aspect, an apparatus is provided. The apparatus includes a cage structure, a cooling plate configured to contain a cooling liquid to cool the cage structure, and a thermal interface material disposed at the second opening and beneath the cooling plate. The cage structure includes a front end, a top surface adjacent to the front end, a first opening at the front end, and a second opening on the top surface. The first opening is configured to receive a pluggable optical module. The cooling plate is disposed on top of the second opening of the cage structure.

The above description is intended by way of example only. Various modifications and structural changes may be made therein without departing from the scope of the concepts described herein and within the scope and range of equivalents of the claims.

What is claimed is:

1. An apparatus comprising:
   a cage structure having a front end, a top surface adjacent to the front end, a first opening at the front end, and a second opening on the top surface, the first opening configured to receive a pluggable optical module; and
   a cooling plate configured to contain a cooling liquid to cool the cage structure, the cooling plate comprising a plurality of heat dissipation fins that have a plurality of fin cuts that include a primary fin cut and a secondary fin cut, wherein the primary fin cut and the secondary fin cut are disposed in the plurality of heat dissipation fins such that at least portions of the plurality of heat dissipation fins are disposed on opposing sides of the primary fin cut and opposing sides of the secondary fin cut, wherein the primary fin cut is parallel to the secondary fin cut, wherein the secondary fin cut has a width greater than that of the primary fin cut, and wherein the cooling plate is disposed on top of the second opening of the cage structure.

2. The apparatus of claim 1, wherein the cooling plate comprises:
   an inlet configured to receive the cooling liquid; and
   an outlet configured to output the cooling liquid from the cooling plate,
   wherein the cooling plate is configured to move the cooling liquid in a flow direction perpendicular to an orientation in which the pluggable optical module resides in the cage structure.

3. The apparatus of claim 2, wherein the plurality of heat dissipation fins are arranged in a longitudinal direction that is aligned with the flow direction.

4. The apparatus of claim 3, wherein the plurality of fin cuts are oriented in a direction that is perpendicular to the flow direction.

5. The apparatus of claim 4, wherein the cage structure includes a plurality of second openings, and wherein the primary fin cut is positioned to coincide with one of the second openings of the cage structure and the secondary fin cut is positioned between adjacent second openings of the cage structure.

6. The apparatus of claim 1, further comprising:
   a deformable pad disposed at the second opening of the cage structure and beneath the cooling plate, wherein the deformable pad is configured to deform by engagement with the pluggable optical module when the pluggable optical module is inserted into the cage structure.

7. The apparatus of claim 6, wherein the deformable pad is configured to deform in thickness at 5 to 80%.

8. The apparatus of claim 6, further comprising:
   an adhesive layer interposed between the cooling plate and the deformable pad.

9. An apparatus comprising:
   a cage structure including a plurality of cages, each of the plurality of cages having a first opening at a front end of the cage structure and a second opening on a top surface of the cage structure, each of the first openings configured to receive a pluggable optical module; and
   a plurality of cooling plates configured to contain a cooling liquid to cool the cage structure, each of the cooling plates comprising a plurality of heat dissipation fins having a plurality of fin cuts that include a primary fin cut and a secondary fin cut, wherein the primary fin cut and the secondary fin cut are disposed in the plurality of heat dissipation fins such that at least portions of the plurality of heat dissipation fins are disposed on opposing sides of the primary fin cut and opposing sides of the secondary fin cut, wherein the primary fin cut is parallel to the secondary fin cut, wherein the secondary fin cut has a width greater than that of the primary fin cut, and wherein said each of the cooling plates is disposed on top of at least one of the second openings of the cages.

10. The apparatus of claim 9, wherein each of the cooling plates comprises:
    an inlet configured to receive the cooling liquid; and
    an outlet configured to output the cooling liquid,
    wherein each cooling plate is configured to move the cooling liquid in a flow direction perpendicular to an orientation in which the pluggable optical module resides in a respective cage.

11. The apparatus of claim 10, wherein the plurality of cooling plates are aligned along a direction parallel to the flow direction, and wherein the plurality of cooling plates are connected in series such that the outlet of one cooling plate is coupled to the inlet of a next cooling plate.

12. The apparatus of claim 10, wherein at least one cooling plate of the plurality of cooling plates is configured to cover a plurality of the second openings.

13. The apparatus of claim 12, wherein the plurality of heat dissipation fins are arranged in a longitudinal direction that is aligned with the flow direction.

14. The apparatus of claim 13, wherein the plurality of fin cuts are oriented in a direction that is perpendicular to the flow direction.

15. The apparatus of claim 14, wherein the primary fin cut is positioned to coincide with one of the second openings of the cage structure and the secondary fin cut is positioned between adjacent second openings of the cage structure.

16. The apparatus of claim 9, further comprising:
    a plurality of deformable pads each disposed at one of the second openings of the cages and beneath an associated cooling plate, wherein each of the deformable pads is configured to deform by engagement with the pluggable optical module when the pluggable optical module is plugged into one of the plurality of cages.

17. The apparatus of claim 16, wherein each of the deformable pads is configured to deform in thickness at 5 to 80%.

18. An apparatus comprising:
a cage structure having a front end, a top surface adjacent to the front end, a first opening at the front end, and a second opening on the top surface, the first opening configured to receive a pluggable optical module;
a cooling plate configured to contain a cooling liquid to cool the cage structure, the cooling plate comprising a plurality of heat dissipation fins having a plurality of fin cuts that include a primary fin cut and a secondary fin cut, wherein the primary fin cut and the secondary fin cut are disposed in the plurality of heat dissipation fins such that at least portions of the plurality of heat dissipation fins are disposed on opposing sides of the primary fin cut and opposing sides of the secondary fin cut, wherein the primary fin cut is parallel to the secondary fin cut, wherein the secondary fin cut has a width greater than that of the primary fin cut, and wherein the cooling plate is disposed on top of the second opening of the cage structure; and
a thermal interface material disposed at the second opening and beneath the cooling plate.

19. The apparatus of claim 18, wherein the plurality of heat dissipation fins are arranged in a longitudinal direction that is aligned with a flow direction of the cooling liquid in the cooling plate.

20. The apparatus of claim 19, wherein the plurality of fin cuts are oriented in a direction that is perpendicular to the flow direction.

* * * * *